United States Patent
Haiss et al.

(10) Patent No.: US 9,408,319 B2
(45) Date of Patent: Aug. 2, 2016

(54) ELECTRONIC COMPONENT HAVING A MOLDED COMPONENT HOUSING

(71) Applicants: Eberhard Haiss, Jungingen (DE);
Martin Rojahn, Tuebingen (DE);
Matthias Taglieber, Tuebingen (DE);
Thomas Schrimpf, Reutlingen (DE);
Matthias Ludwig, Moessingen (DE);
Andreas Blum, Reutlingen (DE)

(72) Inventors: Eberhard Haiss, Jungingen (DE);
Martin Rojahn, Tuebingen (DE);
Matthias Taglieber, Tuebingen (DE);
Thomas Schrimpf, Reutlingen (DE);
Matthias Ludwig, Moessingen (DE);
Andreas Blum, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 263 days.

(21) Appl. No.: 14/094,272

(22) Filed: Dec. 2, 2013

(65) Prior Publication Data
US 2014/0158420 A1 Jun. 12, 2014

(30) Foreign Application Priority Data
Dec. 6, 2012 (DE) .......................... 10 2012 222 491

(51) Int. Cl.
*H05K 7/02* (2006.01)
*H05K 13/00* (2006.01)
(Continued)

(52) U.S. Cl.
CPC .............. *H05K 7/02* (2013.01); *G01C 19/5783* (2013.01); *G01D 11/245* (2013.01); *G01P 1/023* (2013.01); *H05K 13/00* (2013.01); *Y10T 29/49117* (2015.01)

(58) Field of Classification Search
CPC ............. H05K 7/02; H05K 7/12; H05K 7/00; H05K 7/10; H05K 5/02; H05K 5/0247; H05K 3/284; H05K 13/00; H01R 13/405; H01R 13/422; H01R 13/00; H01R 13/6608; H01R 43/16; H01R 43/18; B60R 21/06; G01C 19/5783; G01C 19/5769; G01D 11/245; G01D 11/24; G01P 1/023; G01P 1/02; Y10T 29/49117
USPC ........... 174/50, 520, 521, 535, 536, 541, 377; 361/802, 600, 601, 679.01, 796; 257/666, 669, 678; 73/753
See application file for complete search history.

(56) References Cited

U.S. PATENT DOCUMENTS
4,846,701 A * 7/1989 Hayes ................. H01R 13/6608 257/666
7,151,674 B2 * 12/2006 Sasaki .................... H05K 3/284 174/521

(Continued)

FOREIGN PATENT DOCUMENTS
DE 10 2008 006707 8/2009
DE 10 2009 026804 12/2010

*Primary Examiner* — Angel R Estrada
(74) *Attorney, Agent, or Firm* — Norton Rose Fulbright US LLP

(57) ABSTRACT

An electronic component having a molded component housing and an electrically conductive insert part embedded in the component housing for contacting a micro component, the insert part having an accommodating area for accommodating the micro component with a subarea, which is spaced apart from the micro component, for decoupling the micro component from material stresses of the component housing. A method for manufacturing an electronic component having a molded component housing, an electrically conductive insert part for contacting a micro component being embedded in the component housing, a subarea, which is spaced apart from the micro component, decoupling the micro component from material stresses of the component housing, during curing of the housing material, in an accommodating area for accommodating the micro component on the insert part.

16 Claims, 3 Drawing Sheets

(51) Int. Cl.
  *G01D 11/24* (2006.01)
  *G01P 1/02* (2006.01)
  *G01C 19/5783* (2012.01)

(56) References Cited

U.S. PATENT DOCUMENTS

| | | | | |
|---|---|---|---|---|
| 8,305,769 B2 * | 11/2012 | Schneider | ................ | H05K 7/12 361/802 |
| 8,528,413 B2 * | 9/2013 | Seitz | ................ | G01L 19/0038 73/753 |
| 8,618,425 B2 * | 12/2013 | Hortig | ................ | B81B 7/0064 174/377 |
| 8,931,348 B2 * | 1/2015 | Kunert | ................ | B60R 21/0136 73/714 |
| 8,941,018 B2 * | 1/2015 | Kunert | ................ | H01R 13/405 174/541 |
| 9,107,309 B2 * | 8/2015 | Kurle | ................ | H05K 5/0247 |

* cited by examiner

ELECTRONIC COMPONENT HAVING A
MOLDED COMPONENT HOUSING

RELATED APPLICATION INFORMATION

The present application claims priority to and the benefit of German patent application no. 10 2012 222 491.2, which was filed in Germany on Dec. 6, 2012, the disclosure of which is incorporated herein by reference.

FIELD OF THE INVENTION

The present invention is directed to an electronic component having a molded component housing, and to a method for manufacturing an electronic component, in particular for use in automotive engineering.

BACKGROUND INFORMATION

Such electronic components are believed to be generally understood. The manufacture of electronic components having a micro component, such as yaw rate sensors or acceleration sensors, includes in particular the establishment of a soldered joint between the micro component and a printed circuit board provided for accommodating the micro component. An alternative manufacturing method includes clamping the micro component onto an insert part.

For example, a sensor is discussed in publication DE 10 2008 006 707 A1, having a sensor housing, a sensor module situated therein, and an insert part. The sensor module is joined to the insert part at two opposing outer surfaces. Moreover, a method for manufacturing electronic components is discussed in publication DE 10 2009 026 804 A1, for example, units which are composed of insert parts together with a clamped micro component and which are situated in a frame being extrusion-coated with a separate first coating. The extrusion-coated units are separated from the frame and then extrusion-coated with a second coating.

The manufacture of such electronic components may disadvantageously result in damage to the micro component due to material stresses of the component housing which are transmitted to the micro component, for example when extrusion-coating a unit composed of an insert part and a micro component with a housing material and/or during curing of the housing material. However, in particular an easily damaged micro component having highly sensitive elements, in particular a micro-electromechanical sensor, such as a yaw rate sensor, requires particularly good, and at the same time cost-effective, protection against material stresses, in particular thermomechanical loads and/or mechanical stresses. The electronic components known from the related art are not sufficiently protected from such loads, notably when it comes to cost-critical manufacturing methods, and in particular when it comes to providing a suitable housing material for extrusion-coating. In particular, the manufacture of electronic components having very sensitive elements, as is the case with yaw rate sensors, for example, is additionally associated with increased complexity.

SUMMARY OF THE INVENTION

It is therefore an object of the present invention to make an electronic component available which allows cost-effective protection of the component from loads which occur, in particular during the manufacturing process.

The electronic component according to the present invention having a molded component housing, and the method according to the present invention for manufacturing an electronic component as recited in the other independent claims, have the advantage over the related art that simple and cost-effective protection of the micro component against material stresses, in particular thermomechanical loads and/or in particular mechanical stresses transmitted from the component housing to the micro component, is provided. It is further advantageously possible with the electronic component according to the present invention to avoid signal distortions with the aid of a subarea which in particular is configured to be electrically conductive. In this way, in particular the electromagnetic compatibility of the electronic component is improved. The micro components are in particular micro-electromechanical sensors, for example yaw rate sensors or acceleration sensors, the component according to the present invention, which includes such a micro component, being used in a vehicle, for example.

It is possible according to the present invention to connect the micro component to external systems, for example in a vehicle, via electrically conductive contact pins situated on the insert part. The micro component may be situated in the accommodating area in such a way that the subarea offers protection to the micro component from external impairments or such which originate from the component housing, in particular from mechanical stresses of the component housing and/or undesired electric or electromagnetic effects. It is particularly advantageous for this purpose to position the subarea spaced apart from the micro component to form a kind of buffer area between the component housing and the micro component.

As part of the method for manufacturing the electronic component, a spacer surrounding the micro component may be used to improve a position tolerance during assembly of the insert part with the micro component, the spacer filling the gap and being removed in particular after the micro component has been positioned and/or aligned. Moreover, the subarea in particular has guide grooves for accommodating a cover. It is thus advantageously possible to protect the micro component also from above in the manner already described. Moreover, in particular the subarea and/or the cover is/are configured to be electrically conductive to improve the electromagnetic compatibility. A premolded part for fixing the insert part, and in particular the curved walls, may particularly be provided on the insert part during the injection molding process to ensure sufficient protection of the unit formed of the insert part and the micro component. The method for manufacturing an electronic component having a molded component housing including a housing material in particular includes a first manufacturing step, in which an electrically conductive insert part having an accommodating area for accommodating a micro component is provided. In particular in a second manufacturing step, a subarea which is situated in the accommodating area of the insert part and is spaced apart from the micro component decouples the micro component from mechanical stresses of the component housing, in particular during curing of the housing material. In a third manufacturing step, in particular the insert part is assembled with the micro component to form a unit, and in particular in a fourth manufacturing step the unit is at least partially extrusion-coated to form a housing. This particularly advantageously achieves comparatively high and cost-effective protection of a highly sensitive micro component during manufacturing.

Advantageous embodiments and refinements of the present invention may be found in the subclaims as well as in the description with reference to the drawings.

According to one specific embodiment, it is provided that the subarea of the insert part is in part bent to decouple the micro component from material stresses. It is thus advantageously possible to protect the micro component from impairments by the component housing. The curved or angled subarea, which is also referred to as a wall, is in particular situated in such a way that the subarea at least partially encloses the micro component. The wall may be L-shaped in at least one subarea to form an almost completely closed frame around the micro component, in particular together with at least one further wall. The micro component has an upper side situated in parallel to a main plane of extension of the micro component and a lower side situated opposite and in parallel to the upper side. Moreover, the micro component, which in particular has a cuboid shape, has a side area enclosing the micro component. The lower side of the micro component is positioned in the accommodating area of the insert part for this purpose. The wall is situated in particular within the main plane of extension of the micro component spaced from the side area of the micro component which is situated in the accommodating area of the insert part in such a way that a gap having a gap width is formed between the wall and the micro component. The gap width is in particular selected in such a way that the micro component is not movable, and in particular that an undesired rattling movement of the micro component is not possible. Moreover, the subarea in particular has guide grooves for accommodating a cover. It is thus advantageously possible to protect the micro component also from above in the manner already described. The subarea and/or the cover is/are in particular configured to be electrically conductive to improve the electromagnetic compatibility.

According to one specific embodiment, it is provided that the insert part has a reference mark, which in particular is stamped, for positioning and/or aligning the micro component. With the aid of the reference mark, it is thus advantageously possible to position and align the micro component comparatively precisely in the accommodating area, and in particular at a defined distance from the subarea. The micro component in particular has an electrically conductive force-locked and/or integral joint with the insert part, the micro component being in particular soldered to the insert part with the aid of a solder and/or glued with the aid of a conductive adhesive. It is thus advantageously possible to join in particular the micro component having highly sensitive elements to the insert part without damaging the micro component, for example due to the clamping force caused when clamping the micro component with the aid of a retaining bracket.

According to one specific embodiment, it is provided that the micro component has three solder contact areas, positioned in particular in a triangular shape, or four solder contact areas, positioned in particular in a quadrangular shape, for contacting the insert part, the micro component in particular having a land grid array or a ball grid array.

With solder contact areas which are positioned in a triangular shape on the lower side of the micro component, it is thus advantageously possible to reduce mechanical stresses acting on the micro component and/or to prevent a tilting movement of the micro component as far as possible. With a quadrangular positioning of the solder contact areas on the lower side of the micro components, it is advantageously possible to improve the alignment of the micro component in the accommodating area, which is referred to as floating into position.

According to one specific embodiment, it is provided that the insert part has a structure, in particular a depression, to increase the distance between the micro component and the accommodating area of the insert part in a contact direction which is perpendicular to a main plane of extension of the accommodating area.

It is thus advantageously possible to protect the micro component better in particular from thermally induced or mechanical material stresses and/or to improve the adhesion of the micro component when shear forces occur.

According to one specific embodiment, it is provided that three solder contact areas, positioned in particular in a triangular shape, or four solder contact areas, positioned in particular in a quadrangular shape, for contacting the insert part are formed on the micro component, in particular a land grid array or a ball grid array being formed on the micro component.

It is thus advantageously possible, in the case of a triangular positioning of the solder contact areas, to reduce a tilting movement of the micro component and/or mechanical stresses on the micro component, and in the case of a quadrangular positioning, to improve the floating of the micro component into position, in particular during soldering, and to improve the mechanical shear strength of the micro component on the insert part.

According to one specific embodiment, it is provided that a structure, in particular a depression, is formed on the insert part to increase the distance between the micro component and the accommodating area of the insert part in a contact direction which is perpendicular to a main plane of extension of the accommodating area.

It is thus advantageously possible to mitigate impairments of the micro component caused by thermally induced mechanical stresses.

Exemplary embodiments of the present invention are shown in the drawings and are described in greater detail in the following description.

DETAILED DESCRIPTION

Figure 1:
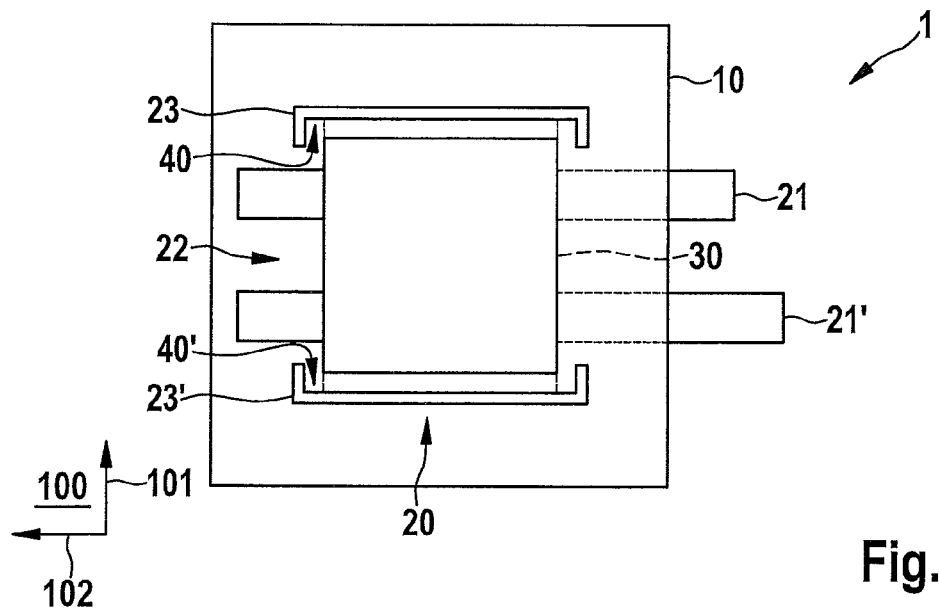
FIG. 1 shows a schematic top view onto the electronic component according to the present invention.

Identical parts are always denoted by the same reference numerals in the various figures and are therefore generally also cited or mentioned only once.

FIG. 1 shows a schematic top view onto electronic component 1 according to the present invention, which is provided for the integration into a vehicle (not shown), for example. Electronic component 1 has a molded component housing 10 and a unit embedded therein composed of an insert part 20 and a micro component 30, in particular a micro-electromechanical sensor, for example a yaw rate sensor or an acceleration sensor. Insert part 20 has an electrically conductive contact pin 21 and a further electrically conductive contact pin 21', which are configured to establish a contact between micro component 30 embedded in molded component housing 10 of component 1 and a device, for example an electrical vehicle system.

Micro component 30 further has an upper side (not shown) facing away from accommodating area 22 of insert part 20, and a lower side (not shown) facing insert part 20 and situated opposite the upper side. Insert part 20 particularly may have an accommodating area 22 for accommodating micro component 30, which in particular extends in a planar manner. For this purpose, the lower side of micro component 30 is electrically conductively force-locked and/or integrally joined with insert part 20 in accommodating area 22 of insert part 20. At least accommodating area 22 of insert part 20 may have a main plane of extension 100, micro component 30, which in particular has a planar extension, being situated in the accommodating area, in particular with the planar extension in parallel to main plane of extension 100.

Insert part 20 moreover has a curved subarea 23, and in particular a curved further subarea 23'. Subarea 23 and further subarea 23' each have a side surface (not shown), which are situated perpendicularly to main plane of extension 100 of accommodating area 22 and are configured to enclose micro component 30 in a frame-like manner, the side surfaces enclosing the micro component at least partially, which may be almost completely. Moreover, curved subarea 23 and further subarea 23' are spaced apart from micro component 30 in a direction parallel to main plane of extension 100 of accommodating area 22 in such a way that a gap 40 having a gap width between subarea 23 and the micro component and a further gap 40' between further subarea 23' and micro component 30 are formed on a side of micro component 30 situated opposite gap 40.

Figure 2:
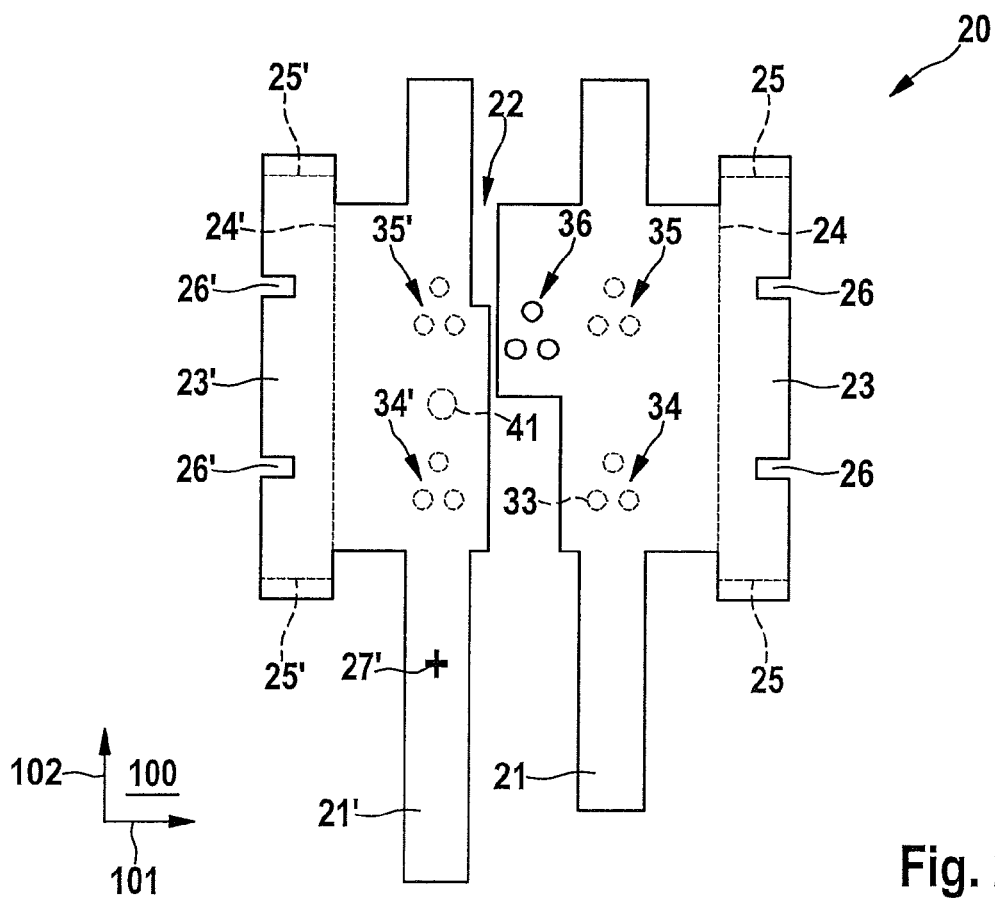
FIG. 2 shows a schematic top view onto the insert part according to the present invention.

FIG. 2 shows a schematic top view onto the insert part according to the present invention. Insert part 20 is provided in particular as a stamped insert part 20, insert part 20 having a contact pin 21 and a further contact pin 21'. Contact pins 21, 21' are configured, for example, to supply the micro component with electrical energy and/or for signal transmission. Subarea 23 of insert part 20 and further subarea 23' of insert part 20 are each configured to form a frame-like structure, in particular a cage-shaped or basket-shaped structure which is open toward a side facing away from insert part 20, which encloses accommodating area 22, in particular micro component 30 positioned in accommodating area 22. At setpoint bending points 24, 24' provided for this purpose, subareas 23, 23' are each bent in parallel to a main extension direction 102 of contact pins 21, 21' situated in parallel to each other along the main extension direction. Subareas 23, 23' are bent in a direction 103 perpendicular to main extension direction 102 of accommodating area 22 for this purpose. Moreover, further setpoint bending points 25, 25' for forming an at least partly L-shaped subarea are situated at each of two opposing ends of subareas 23, 23' of the stamped insert part, the L-shaped subarea having the L shape in a top view onto main plane of extension 100 of accommodating area 22.

Guide grooves 26 are provided in particular on subarea 23, and further guide grooves 26' are provided on further subarea 23', to accommodate a cover (not shown), which is placed on the bent subareas laterally enclosing micro component 30 at least partially on the sides and which is soldered in particular to the subarea. To further enhance the electromagnetic compatibility, in particular as protection from signal distortions, the cover and in particular also subareas 23, 23' are configured to be electrically conductive. Micro component 22 may have three solder contact areas 34, 34', 36, which may be positioned at three different corners of an equilateral triangle, for contacting insert part 20. The triangular positioning of solder contact areas 34, 34', 36 advantageously makes it possible to reduce mechanical stress on micro component 30. It is further advantageously possible by selecting the location of the triangular positioning of solder contact areas 34, 34', 36 to prevent a tilting movement of micro component 30 and thus ensure better retention of micro component 30 in accommodating area 22 of insert part 20.

Solder contact areas 34, 34', 35, 35' may further be positioned at four different corners of a square or rectangle. This advantageously makes it possible to achieve improved floating of micro component 30 into position, in particular during soldering or bonding with insert part 20, and increased mechanical shear strength of micro component 30 on insert part 20.

Each solder contact area 34, 34', 35, 35', 36 in particular has 1 to 5 sub-contact points 33, FIG. 2 showing three such sub-points by way of example.

In particular stamped solder contact depressions (not shown) are formed in particular in accommodating area 22 of insert part 20 at the points intended for an optimal position of micro component 30 in order to particularly easily position and align micro component 30 on insert part 20, in particular in an automated manner. Moreover, an in particular circular or cross-shaped marking 27', referred to as a reference mark 27', is provided, in particular stamped, on insert part 20, to achieve particularly precise positioning and alignment of micro component 30 by a pick-and-place machine (not shown) with positioning accuracy in the micrometer range.

Moreover, in particular one or multiple stamped holes 41 are formed in insert part 20 in an area in which a short circuit is to be prevented between the measuring contact points (not shown) of micro component 30 which are situated on the lower side of micro component 30 in adjacent locations. A short circuit may be caused by solder balls or other electrically conductive particles, for example.

Figure 3:
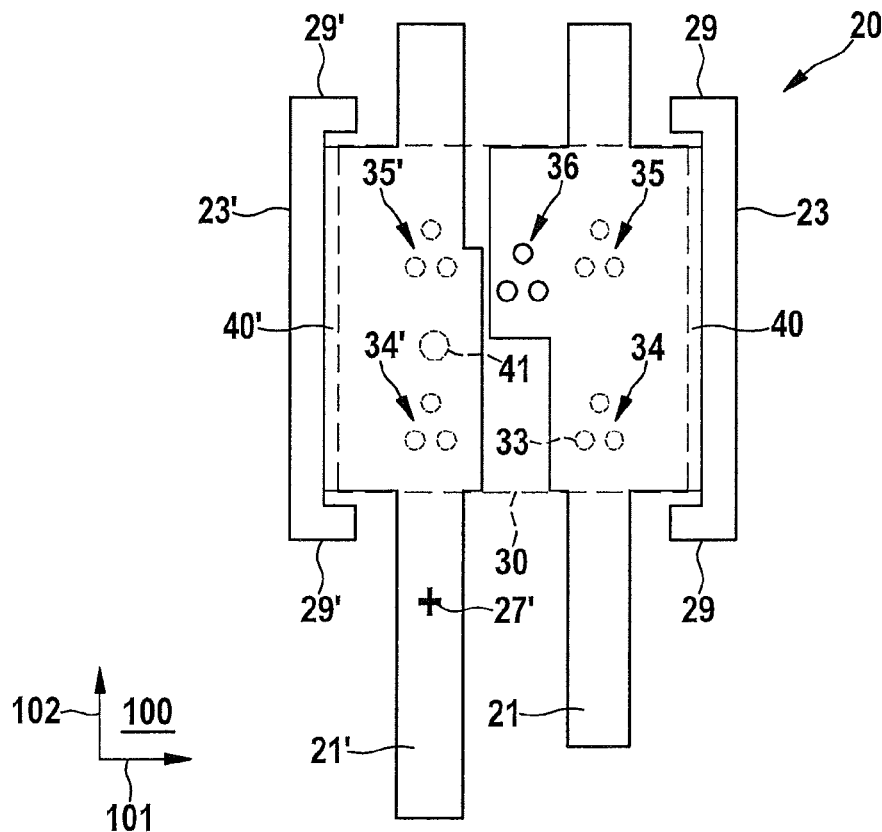
FIG. 3 shows a schematic top view onto the insert part having a micro component according to the present invention.

FIG. 3 shows a schematic top view onto insert part 20 having a micro component 30 according to the present invention.

Subarea 23 and further subarea 23' are configured as walls 23, 23' which are perpendicular to main plane of extension 100 of accommodating area 22 of insert part 20 and which in particular extend out of drawing plane 100 toward an observer and are bent upward in an observation direction. Wall 23 of subarea 23 and further wall 23' of further subarea 23' together form an accommodating area 22 of insert part 20 which has a basket-shaped configuration in main plane of extension 100 of micro component 30 and is open in particular on the side of wall 23 or of further wall 23' facing away from insert part 20, micro component 30 being positioned in the accommodating area. A gap 40 having a gap width is formed between micro component 30 and the wall, and a further gap 40' having a further gap width, in particular the same gap width, is formed between micro component 30 and the further wall. The wall and the further wall are in particular configured to be electrically conductive to enhance the electromagnetic compatibility, and for example as protection of micro component 30 from signal distortions. Moreover, wall 23 and in particular further wall 23' achieve sufficient protection of the, in particular highly sensitive, micro component from mechanical stresses, in particular when extrusion-coating the unit composed of insert part 20 and micro component 30.

Insert part 20 is configured in particular for forming gap widths between micro component 30 and walls 23, 23' in such a way that a movement of micro component 30 parallel to main plane of extension 100 is precluded, in particular under consideration of the tolerances that are achievable by the pick-and-place machine. The pick-and-place machine is in particular configured to position and align micro component 30 on insert part 20, for example with an accuracy of approximately 35-50 micrometers.

A premolded part for fixing insert part 20 and wall 23 and further wall 23' of subarea 23 and further subarea 23' enclosing micro component 30 at least partially, in particular for forming component housing 10 during an injection molding process, is provided on insert part 20. This ensures sufficient protection from bending and/or torsion of individual parts of the unit composed of insert part 20 and micro component 30 in relation to each other, in particular during extrusion-coating in the injection molding process. The premolded part holds insert part 20 and subareas 23, 23' in the intended positions in relation to each other and in relation to micro component 30.

Figure 4:
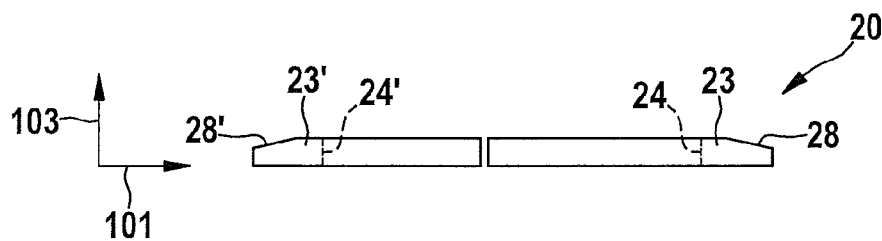
FIG. 4 shows a schematic side view of the insert part according to the present invention.

FIG. 4 shows a schematic side view of insert part 20 according to the present invention. Wall 23 of subarea 23 has a bevel 28, and further wall 23' of further subarea 23' has a further bevel 28', each being provided for particularly simple, and in particular automated, assembly of micro component 30, which is provided with a spacer (not shown), onto insert part 20. The gap widths of gaps 40, 40' are configured in particular to accommodate the spacer in the respective gap 40, 40'. The spacer in particular partially encloses micro component 30 along a side area of micro component 30 in a frame-like manner to improve the position tolerances. The spacer may be removed after micro component 30 has been joined to insert part 20. As an alternative, the spacer has a material, in particular a damping material, which protects micro component 30 from mechanical stresses to prevent a movement of micro component 30, in particular parallel to main extension of extension 100 of accommodating area 22.

Figure 5:
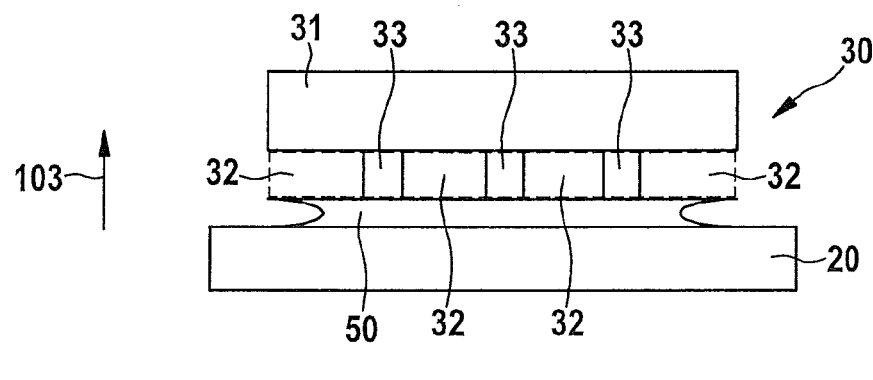
FIG. 5 shows a schematic side view of a first specific embodiment of the insert part having a micro component according to the present invention.

FIG. 5 shows a schematic side view of a first specific embodiment of insert part 20 having a micro component 30 according to the present invention. On a lower side facing insert part 20, micro component 30 is integrally joined to insert part 20 in accommodating area 22 with the aid of a conducting joining arrangement 50, in particular a soldering arrangement 50 or an adhesive arrangement 50. Micro component 30 in particular has a molding compound 31 and a laminate 32, sub-contact points 33 of solder contact points 34, 34', 35, 35', 36 which penetrate the laminate in a contact direction 103 perpendicularly to main plane of extension 100 of accommodating area 22 being formed in the area of laminate 32, FIG. 5 showing three sub-contact points 33 (see also FIG. 2) by way of example. To increase the protection of the micro component from thermally induced mechanical stresses, and in particular to improve the adhesion of the micro component during shear forces which occur during the injection molding process, for example, the distance between micro component 30 and insert part 20 in contact direction 103 is adapted, for example by modifying the solder quantity, modifying the expansion of solder contact areas 34, 34', 35, 35', 36 and/or the size of contact points 37 (see FIG. 7) of a ball grid array formed on the lower side of micro component 30.

Figure 6:
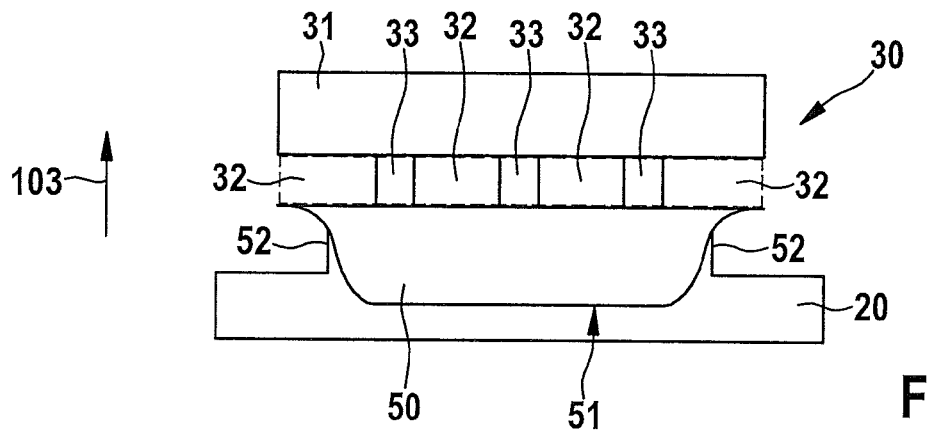
FIG. 6 shows a schematic side view of a second specific embodiment of the insert part having a micro component according to the present invention.

FIG. 6 shows a schematic side view of a second specific embodiment of insert part 20 having a micro component 30 according to the present invention. Insert part 20 has a depression 51, in particular a stamped depression, for accommodating joining arrangement 50, a pointed trailing edge 52 which frames depression 51 being formed in an edge area of depression 51. A comparatively large distance is possible between micro component 30 and insert part 20 with the aid of depression 51 formed in the insert part, a solder meniscus which protrudes over the trailing edge being formed parallel to main extension direction 100 of accommodating area 22.

Figure 7:
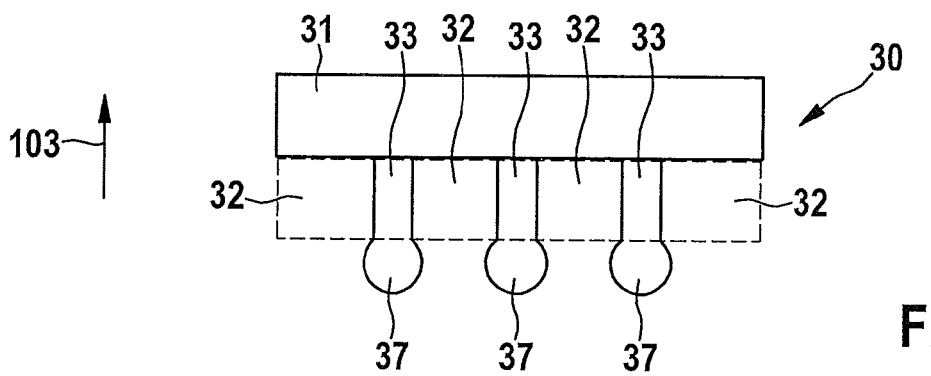
FIG. 7 shows a schematic side view of a first specific embodiment of the micro component according to the present invention.

FIG. 7 shows a schematic side view of a first specific embodiment of micro component 30 according to the present invention. On the lower side, micro component 30 has a ball grid array having ball-shaped conductive contacts 37, solder contact depressions (not shown) being situated in accommodating area 22 of insert part 20 in particular for particularly simple and precise positioning.

Figure 8:
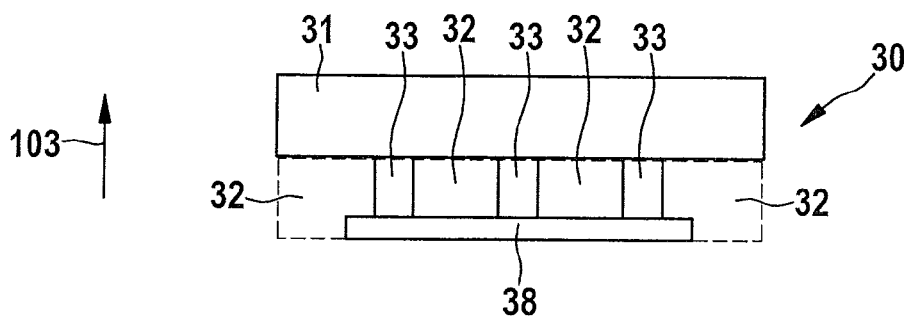
FIG. 8 shows a schematic side view of a second specific embodiment of the micro component according to the present invention.

FIG. 8 shows a schematic side view of a second specific embodiment of micro component 30 according to the present invention.

On the lower side, micro component 30 has a land grid array having a planar conductive contact surface 38. In particular two to five mutually spaced sub-contact points 33, which penetrate laminate 32 in contact direction 103, are formed in micro component 30. Sub-contact points 33 are closed in particular in contact direction 103 at two opposing ends to avoid the formation of solder cavities in solder contact points 33 due to air entrapment.

What is claimed is:

1. An electronic component, comprising:
    a micro component;
    a molded component housing; and
    an electrically conductive insert part embedded in the component housing for contacting the micro component, wherein the insert part includes:
        an accommodating area for accommodating the micro component;
        at least one of solder and an adhesive, which is on a portion of the accommodating area and connects the accommodating area to the micro component; and
        walls that at least partially enclose the accommodating area and are spaced apart from the micro component, for decoupling the micro component from material stresses of the component housing.

2. The electronic component of claim 1, wherein the insert part includes a reference mark for at least one of positioning and aligning the micro component.

3. The electronic component of claim 2, wherein the reference mark is a stamped reference mark.

4. The electronic component of claim 1, wherein the insert part has a structural element, which is a depression, for increasing the distance between the micro component and the accommodating area of the insert part in a contact direction which is perpendicular to a main plane of extension of the accommodating area.

5. The electronic component of claim 1, wherein the micro component is arranged in the accommodating area between a first one of the walls at a first side and a second one of the walls at a second side, the walls not extending from the first side to the second side.

6. The electronic component of claim 1, wherein the at least one of the solder and the adhesive is electrically conductive, providing an electrically conductive connection of the micro component to the insert part.

7. The electronic component of claim 1, wherein the walls (a) are configured to be partially bent to decouple the micro component from material stresses, and (b) include guide grooves for accommodating a cover.

8. The electronic component of claim 1, wherein the micro component has three solder contact areas, positioned in a triangular shape, or four solder contact areas, positioned in a quadrangular shape, for contacting the insert part, the micro component having a land grid array or a ball grid array.

9. An The electronic component comprising:
a molded component housing; and
an electrically conductive insert part embedded in the component housing for contacting a micro component, wherein the insert part includes an accommodating area for accommodating the micro component with a subarea that (a) is spaced apart from the micro component, (b) is configured to be partially bent to decouple the micro component from material stresses of the component housing, and (c) includes guide grooves for accommodating a cover.

10. An electronic component comprising:
a micro component
a molded component housing; and
an electrically conductive insert part embedded in the component housing for contacting a micro component, wherein:
the insert part includes an accommodating area for accommodating the micro component with a subarea, which is spaced apart from the micro component, for decoupling the micro component from material stresses of the component housing; and
the micro component includes:
contact areas for contacting the insert part, the contact areas being (a) three solder contact areas arranged in a triangular shape, or (b) four solder contact areas arranged in a quadrangular shape; and
a land grid array or a ball grid array.

11. A method for manufacturing an electronic component having a molded component housing, the method comprising:
embedding an electrically conductive insert part for contacting a micro component in a housing material of the component housing; and
installing the micro component in the insert part;
wherein the insert part includes:
an accommodating area for accommodating the micro component;
walls that at least partially enclose the accommodating area, are spaced apart from the micro component, and decouple the micro component from material stresses of the component housing during curing of the housing material; and
at least one of solder and an adhesive, which is on a portion of the accommodating area and connects the accommodating area to the micro component.

12. The method of claim 11, wherein a structure, which is a depression, is formed on the insert part for increasing the distance between the micro component and the accommodating area of the insert part in a contact direction which is perpendicular to a main plane of extension of the accommodating area.

13. The method of claim 11, wherein three solder contact areas, positioned in a triangular shape, or four solder contact areas, positioned in a quadrangular shape, for contacting the insert part are formed on the micro component, a land grid array or a ball grid array being formed on the micro component.

14. A method for manufacturing an electronic component that includes a molded component housing, the method comprising:
embedding an electrically conductive insert part for contacting a micro component in a housing material of the component housing; and
installing the micro component in an accommodating area of the insert part;
wherein:
the insert part includes a subarea, which is spaced apart from the micro component and which decouples the micro component from material stresses of the component housing during curing of the housing material;
the micro component includes contact areas for contacting the insert part;
the contact areas include three solder contact areas arranged in a triangular shape, or four solder contact areas arranged, in a quadrangular shape; and
a land grid array or a ball grid array is formed on the micro component.

15. An electronic component for use in automotive engineering, comprising:
an electronic component, including:
a micro component that includes a micro-electromechanical sensor;
a molded component housing; and
an electrically conductive insert part embedded in the component housing for contacting the micro component;
wherein the insert part includes:
an accommodating area for accommodating the micro component;
at least one of solder and an adhesive, which is on a portion of the accommodating area and connects the accommodating area to the micro component and
walls that at least partially enclose the accommodating area and are spaced apart from the micro component, for decoupling the micro component from material stresses of the component housing.

16. The electronic component of claim 15, wherein the micro-electromechanical sensor is a yaw rate sensor.

* * * * *